United States Patent
Goto et al.

(10) Patent No.: US 11,203,121 B2
(45) Date of Patent: *Dec. 21, 2021

(54) ROBOT, CONTROL DEVICE OF ROBOT, AND METHOD OF TEACHING POSITION OF ROBOT

(71) Applicant: KAWASAKI JUKOGYO KABUSHIKI KAISHA, Kobe (JP)

(72) Inventors: Hirohiko Goto, Akashi (JP); Tetsuya Yoshida, Kakogawa (JP); Haruhiko Tan, Kobe (JP); Kazuo Fujimori, Akashi (JP); Katsuhiro Yamashita, Kakogawa (JP); Masahiko Sumitomo, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 400 days.

This patent is subject to a terminal disclaimer.

(21) Appl. No.: 16/337,488

(22) PCT Filed: Sep. 26, 2017

(86) PCT No.: PCT/JP2017/034693
§ 371 (c)(1),
(2) Date: Mar. 28, 2019

(87) PCT Pub. No.: WO2018/062153
PCT Pub. Date: Apr. 5, 2018

(65) Prior Publication Data
US 2019/0344446 A1 Nov. 14, 2019

(30) Foreign Application Priority Data
Sep. 28, 2016 (JP) .............................. JP2016-189148

(51) Int. Cl.
*B25J 9/16* (2006.01)

(52) U.S. Cl.
CPC ............. *B25J 9/1697* (2013.01); *B25J 9/163* (2013.01); *B25J 9/1661* (2013.01); *B25J 9/1692* (2013.01)

(58) Field of Classification Search
CPC ........ B25J 9/1697; B25J 9/163; B25J 9/1661; B25J 9/1692; B25J 11/0095; B25J 9/1664;
(Continued)

(56) References Cited

U.S. PATENT DOCUMENTS

| 4,871,252 A | 10/1989 | Beni et al. |
| 2004/0202362 A1 | 10/2004 | Ishikawa et al. |

(Continued)

FOREIGN PATENT DOCUMENTS

JP 2012-152898 A 8/2012

*Primary Examiner* — Robert T Nguyen
(74) *Attorney, Agent, or Firm* — Oliff PLC

(57) ABSTRACT

A control device of robot includes: image data acquirer configured to acquire image data taken by camera, image data including a teaching substrate and a substrate placing portion of a hand, the teaching substrate arranged as a teaching target at substrate target position; a virtual substrate information generator configured to generate information of a virtual substrate virtually arranged at the substrate placing portion of the hand in image data of the camera; distance information calculator configured to calculate distance information from substrate placing portion to the teaching substrate based on image data of the camera; operation control unit configured to control operation of robot arm based on distance information from the substrate placing portion to the teaching substrate such that the virtual substrate coincides with the teaching substrate; and storage unit configured to store, as teaching data, position of the hand when the virtual substrate coincides with the teaching substrate.

6 Claims, 8 Drawing Sheets

(58) Field of Classification Search
CPC ... B25J 13/08; B25J 19/023; H01L 21/67778; H01L 21/67766; H01L 21/681; H01L 21/67259; H01L 21/67276; H01L 21/67742; G05B 2219/40006; G05B 2219/36412; G05B 19/42; G05B 2219/45031
See application file for complete search history.

(56) References Cited

U.S. PATENT DOCUMENTS

| | | | |
|---|---|---|---|
| 2009/0222135 A1* | 9/2009 | Asakawa | H01L 21/681 700/253 |
| 2015/0235888 A1* | 8/2015 | Iida | H01L 21/68707 414/783 |
| 2016/0055425 A1* | 2/2016 | Minami | G05B 19/425 706/12 |
| 2019/0202055 A1* | 7/2019 | Wang | B25J 9/1671 |
| 2020/0376657 A1* | 12/2020 | Adachi | B25J 9/1697 |
| 2021/0089040 A1* | 3/2021 | Ebrahimi Afrouzi | A47L 9/2894 |

* cited by examiner

ROBOT, CONTROL DEVICE OF ROBOT, AND METHOD OF TEACHING POSITION OF ROBOT

TECHNICAL FIELD

The present invention relates to a robot, a control device of the robot, and a method of teaching a position of the robot.

BACKGROUND ART

In the field of semiconductor devices and liquid crystal devices, teaching of robots is becoming more difficult due to an increase in complexity of the devices and an increase in size of carried objects. Teaching correct positions to robots is extremely important for reliability of the robots. Under such circumstances, teaching errors caused by insufficient skills of operators are serious problems. Therefore, a technology of teaching the correct positions to the robots without depending on the skills of the operators is required.

PTL 1 discloses a technology in which: an end effector provided at a wrist of a robot is brought into contact with a target; and a control unit detects a position of the target by acquiring a position of the end effector that is in contact with the target.

CITATION LIST

Patent Literature

PTL 1: Japanese Laid-Open Patent Application Publication No. 2012-152898

SUMMARY OF INVENTION

Technical Problem

According to the method of PTL 1, when teaching the position to the robot, the end effector needs to be brought into contact with the target. Therefore, problems, such as errors, may arise. Thus, there is still room for improvement in terms of teaching accuracy.

The present invention was made to solve the above problems, and an object of the present invention is to accurately teach a correct position to a robot without depending on a skill of an operator.

Solution to Problem

To solve the above problem, a robot according to an aspect of the present invention is a robot configured to carry a substrate to a substrate target position at which the substrate is to be placed, the robot including: a robot arm; a hand attached to a tip end of the robot arm; a camera fixed and attached to a portion of the hand other than a substrate placing portion of the hand so as to take an image of the substrate placing portion, the substrate being placed at the substrate placing portion; an image data acquirer configured to acquire image data taken by the camera, the image data including a teaching substrate and the substrate placing portion of the hand, the teaching substrate being arranged as a teaching target at the substrate target position; a virtual substrate information generator configured to generate information of a virtual substrate virtually arranged at the substrate placing portion of the hand in the image data of the camera; a distance information calculator configured to calculate distance information from the substrate placing portion to the teaching substrate based on the image data of the camera; an operation control unit configured to control an operation of the robot arm based on the distance information from the substrate placing portion to the teaching substrate such that the virtual substrate coincides with the teaching substrate; and a storage unit configured to store, as teaching data, a position of the hand when the virtual substrate has coincided with the teaching substrate.

According to the above configuration, only by taking the image of the space including the teaching substrate as the teaching target at the substrate target position and the substrate placing portion of the hand, the distance information from the substrate placing portion to the teaching substrate can be calculated based on the camera image, and the operation of the robot can be controlled based on the distance information such that the virtual substrate virtually arranged at the substrate placing portion of the hand coincides with the teaching substrate. By storing the position of the hand at this time as a teaching point, the position of the hand corresponding to the substrate target position can be taught to the robot. With this, the correct position can be accurately taught to the robot without depending on the skill of the operator. Herein, storing the position of the hand as the teaching data denotes that, for example, the position of the hand is stored (registered) as information, such as an operation program, that is reproducible by a robot controller. It should be noted that the teaching substrate may be a simulated substrate having the same shape as an actual substrate. The camera may be fixed and attached to a base end portion of the hand.

The distance information calculator may calculate the distance information from the substrate placing portion to the teaching substrate by pattern matching between an image of the virtual substrate and an image of the teaching substrate.

A control device of a robot according to another aspect of the present invention is a control device of a robot, the robot including: a robot arm; a hand attached to a tip end of the robot arm; and a camera fixed and attached to a portion of the hand other than a substrate placing portion of the hand so as to take an image of the substrate placing portion, a substrate being placed at the substrate placing portion, wherein the robot carries the substrate to a substrate target position at which the substrate is to be placed, the control device including: an image data acquirer configured to acquire image data taken by the camera, the image data including a teaching substrate and the substrate placing portion of the hand, the teaching substrate being arranged as a teaching target at the substrate target position; a virtual substrate information generator configured to generate information of a virtual substrate virtually arranged at the substrate placing portion of the hand in the image data of the camera; a distance information calculator configured to calculate distance information from the substrate placing portion to the teaching substrate based on the image data of the camera; a robot operation control unit configured to control an operation of the robot arm based on the distance information from the substrate placing portion to the teaching substrate such that the virtual substrate coincides with the teaching substrate; and a storage unit configured to store, as teaching data, a position of the hand when the virtual substrate has coincided with the teaching substrate.

A method of teaching a position of a robot according to yet another aspect of the present invention is a method of teaching a position of a hand of a robot configured to carry a substrate to a substrate target position at which the substrate is to be placed, the method including: arranging a teaching substrate as a teaching target at the substrate target position; fixing and attaching a camera to a portion of the hand other than a substrate placing portion of the hand such that the camera takes an image of the substrate placing portion, the substrate being placed at the substrate placing portion; moving the robot to a predetermined position at which the camera is able to take an image of a space including the teaching substrate and the substrate placing portion of the hand; acquiring image data taken by the camera, the image data including the teaching substrate and the substrate placing portion of the hand, the teaching substrate being arranged as the teaching target at the substrate target position; generating information of a virtual substrate virtually arranged at the substrate placing portion of the hand in the image data of the camera; calculating distance information from the substrate placing portion to the teaching substrate based on the image data of the camera; controlling an operation of the robot based on the distance information from the substrate placing portion to the teaching substrate such that the virtual substrate coincides with the teaching substrate; and storing in a storage unit as teaching data, a position of the hand when the virtual substrate has coincided with the teaching substrate.

Advantageous Effects of Invention

According to the present invention, the correct position can be accurately taught to the robot without depending on the skill of the operator.

DESCRIPTION OF EMBODIMENTS

An embodiment of the present invention will be explained with reference to the drawings. Hereinafter, the same reference signs are used for the same or corresponding components, and a repetition of the same explanation is avoided.

Embodiment

Semiconductor Processing Equipment

Figure 1:
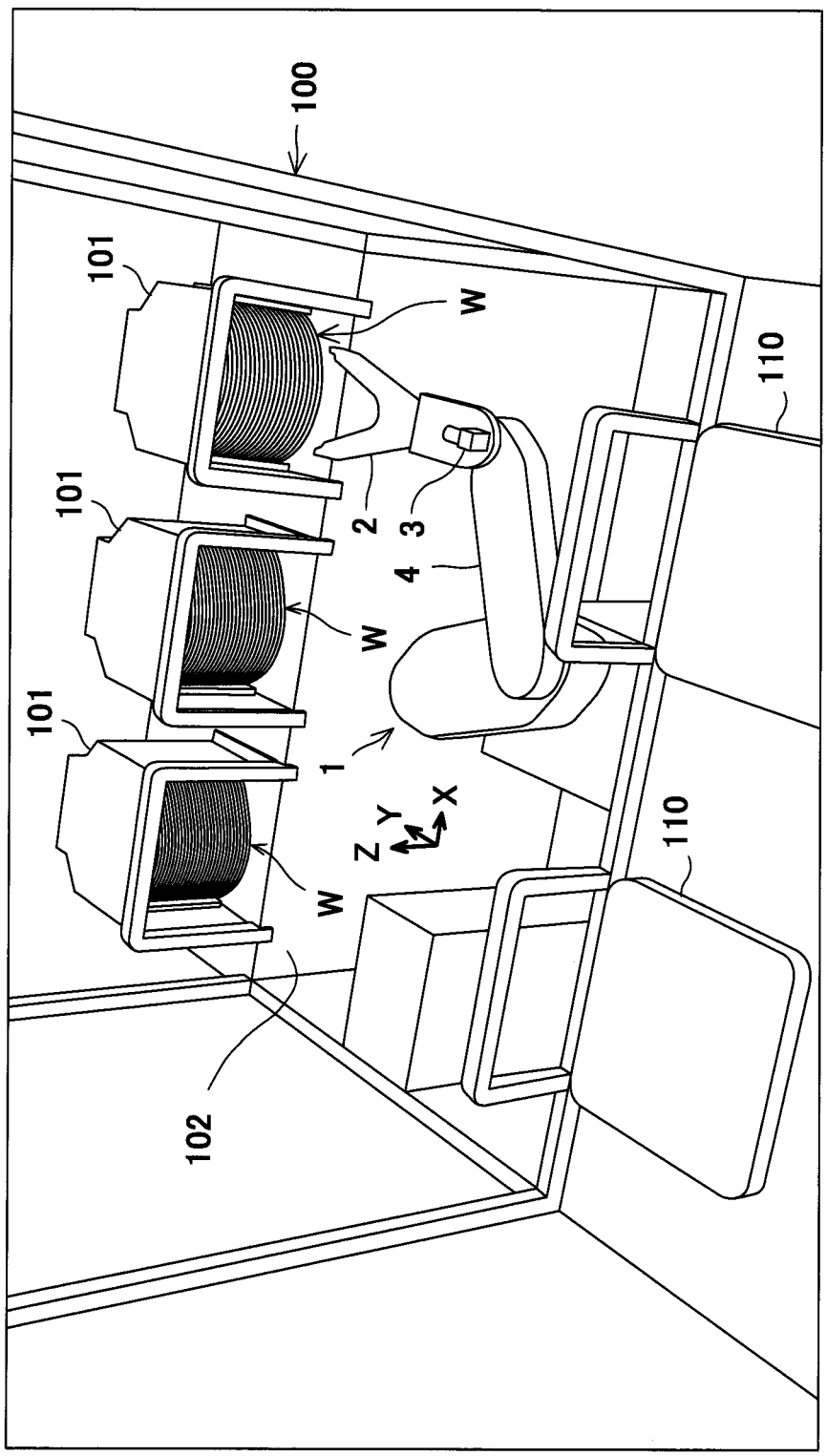
FIG. 1 is a perspective view schematically showing the configuration of semiconductor processing equipment including a robot according to an embodiment of the present invention.

FIG. 1 is a perspective view showing semiconductor processing equipment including a robot according to the embodiment of the present invention. Semiconductor processing equipment 100 is equipment for processing semiconductor wafers. Examples of the semiconductor wafers include silicon wafers, sapphire (single crystal alumina) wafers, and other various wafers. Further, examples of glass wafers include FPD (Flat Panel Display) glass substrates and MEMS (Micro Electro Mechanical Systems) glass substrates. The semiconductor processing equipment 100 is configured based on, for example, the SEMI (Semiconductor Equipment and Materials International) standards. In this case, a below-described FOUP 101 follows the specification of the SEMI standards. The semiconductor processing equipment 100 may be configured without being based on the SEMI standards.

Semiconductor wafers (hereinafter may be simply referred to as "substrates") W before and after processing are accommodated in a container called a Front Opening Unified Pod (FOUP) 101. The FOUP 101 is related to a local cleaning technology and is a mini-environment substrate container in a clean environment. A plurality of substrates W are accommodated in three FOUPs 101. The substrates W are horizontally accommodated in the FOUPs 101 and arranged at regular intervals in an upper-lower direction Z. Each of the FOUPs 101 is formed in a substantially box shape on a base 102 and is open toward one side. The semiconductor processing equipment 100 includes a substrate processing apparatus 110 configured to process the substrate W. Examples of the processing of the substrate W include process treatments, such as a heat treatment, an impurity introducing treatment, a thin film forming treatment, a lithography treatment, a cleaning treatment, and a flattening treatment. The substrate W is carried between the FOUP 101 and the substrate processing apparatus 110 by a robot 1.

Robot

Figure 2:
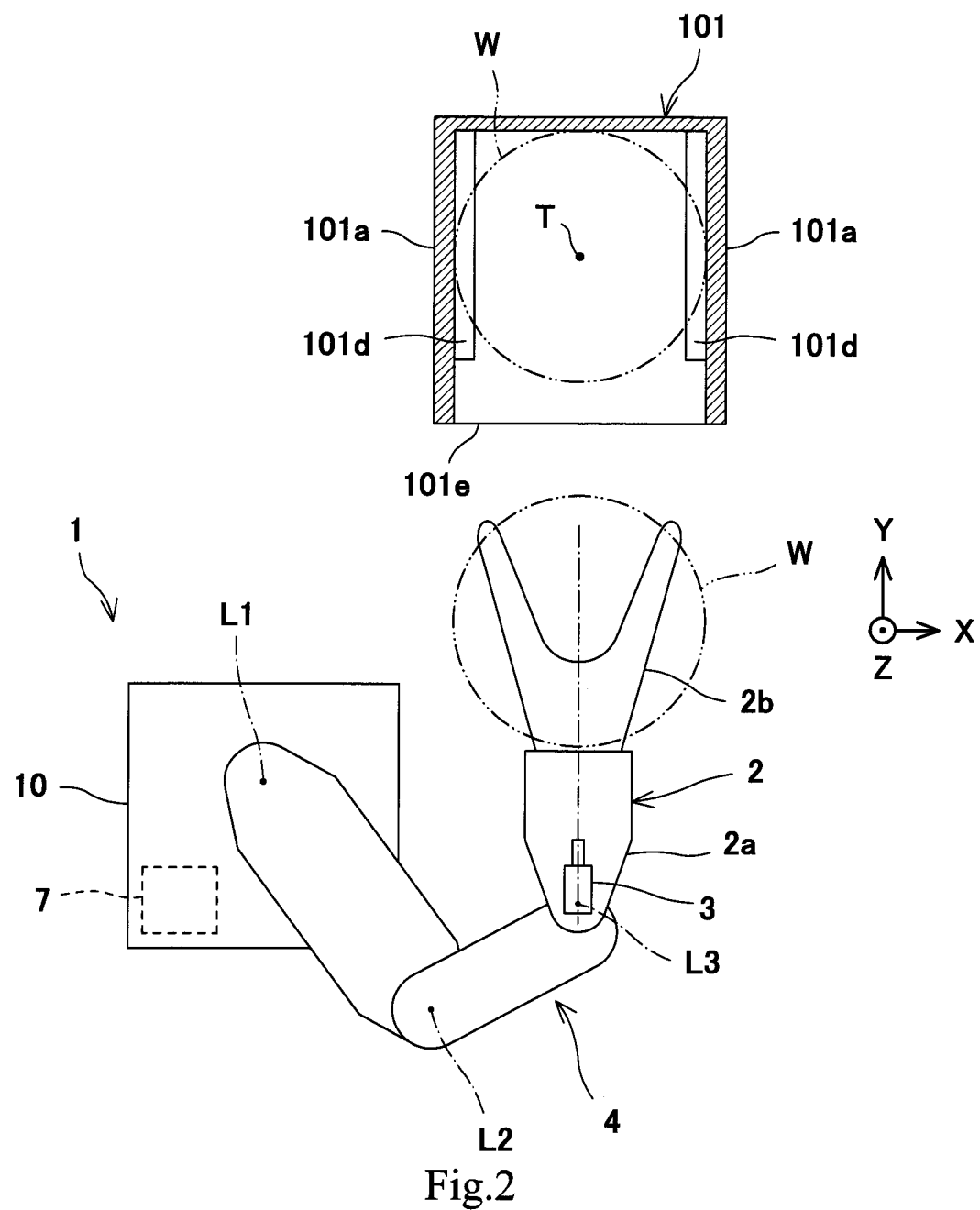
FIG. 2 is a plan view schematically showing the configurations of the robot and a FOUP.

FIG. 2 is a plan view schematically showing the configurations of the robot and the FOUP accommodating the substrate according to the embodiment of the present invention. The FOUP 101 is shown as an X-Y sectional view. As shown in FIG. 2, the FOUP 101 includes: a pair of side walls 101a opposed to each other; and plural pairs of substrate supporting portions 101d provided at the side walls 101a. The substrate supporting portions 101d support end portions of the substrates W such that: each substrate W takes a horizontal posture; and the substrates W are lined up at intervals in the upper-lower direction. A front surface of the FOUP 101 constitutes a front-surface opening 101e that is open.

The robot 1 carries the substrate W out from the FOUP 101 and carries the substrate W in the FOUP 101 through the front-surface opening 101e. To be specific, the robot 1 is a robot configured to carry the substrate W to a substrate target position T at which the substrate W is to be placed. The robot 1 includes a robot arm 4 and a hand 2 attached to a tip end of the robot arm 4. The robot 1 takes out the substrate W from the FOUP 101 and puts the substrate W in the FOUP 101 by the hand 2. As shown in FIG. 2, for example, the substrate W supported by the substrate supporting portions 101d is a teaching target, and a center of the substrate W when viewed from a vertical direction is the substrate target position T. However, the present embodiment is not limited to this. The target position T is a position set such that: a below-described control unit of the robot 1 stores, as teaching data, the position of the hand when the teaching substrate W and a below-described virtual substrate have coincided with each other; and with this, the robot 1 can carry the substrate W out from the FOUP 101 and carry the substrate W in the FOUP 101. A camera 3 is fixed to a wrist 2a (base end portion) formed at a base end side of the hand 2 of the robot 1. In the present embodiment, the camera 3 is fixed and attached to the wrist 2a so as to be able to take an image of a blade 2b of the hand 2 but may be fixed and attached to a different portion except for the blade 2b. The camera 3 is constituted by a CCD (Charge Coupled Device) camera, a CMOS (Complementary Metal Oxide Semiconductor) camera, or the like. The blade 2b corresponds to a "substrate placing portion" of the hand 2 and is a portion at which the substrate W is placed.

Hereinafter, a direction in which a below-described rotation axis L1 of the robot 1 is referred to as a Z direction or the upper-lower direction. A direction perpendicular to the Z direction is referred to as an X direction or a left-right direction. A direction perpendicular to the Z direction and the X direction is referred to as a Y direction or a front-rear direction. In the present embodiment, the X direction is set as a direction from the robot 1 toward the FOUP 101 and its opposite direction.

Figure 3:
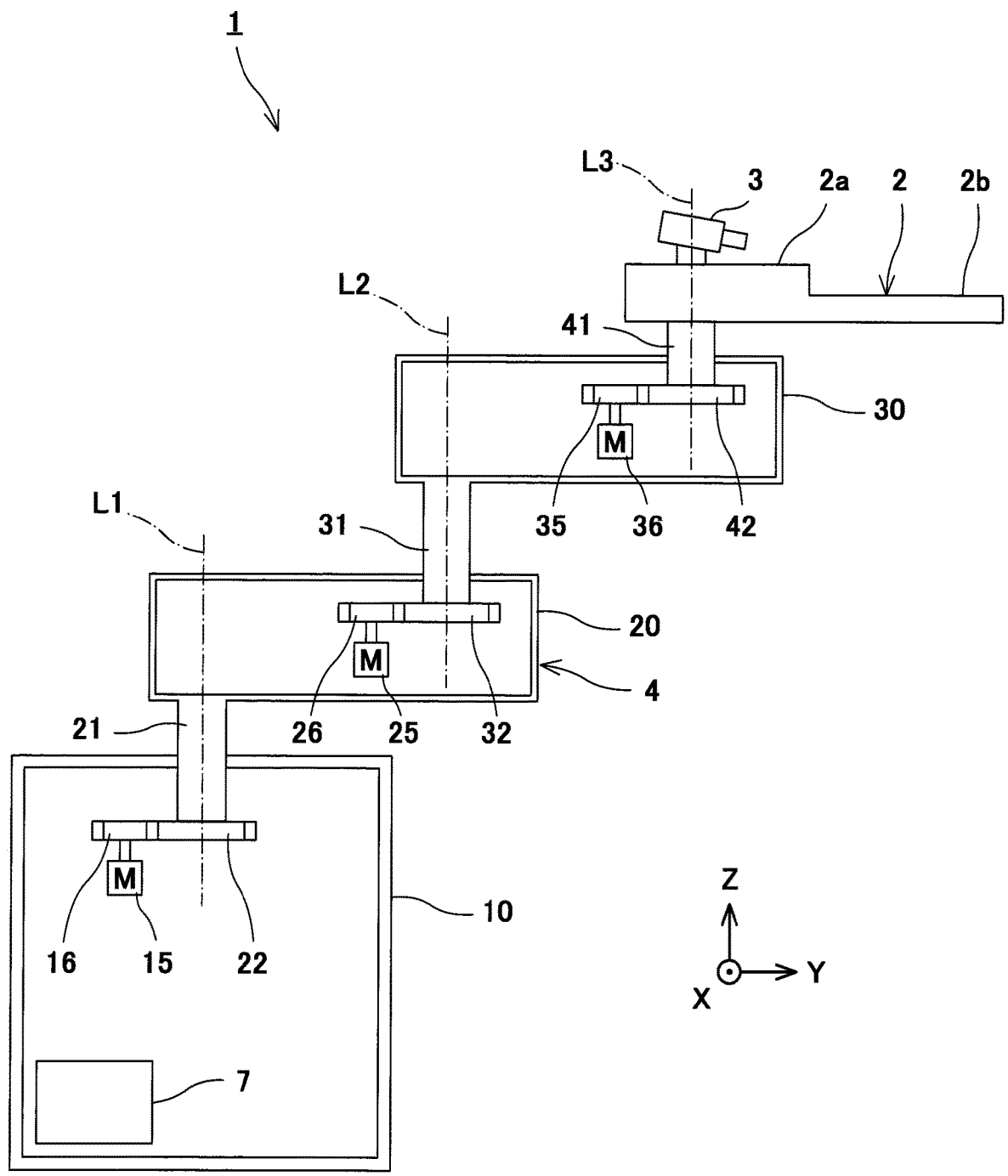
FIG. 3 is a diagram schematically showing the configuration of an internal mechanism of the robot.

FIG. 3 is a diagram schematically showing the configuration of an internal mechanism of the robot 1. As shown in FIG. 3, the robot 1 includes a base 10, the robot arm 4, the hand 2, the camera 3 attached to the hand 2, and a control device 7 configured to control an operation of the robot 1. The robot arm 4 is constituted by a lower arm 20 and an upper arm 30.

The base 10 is, for example, a hollow cylindrical member. A lower arm driving portion 15 and the control device 7 are provided in the base 10, and the lower arm driving portion 15 includes a servo motor and a lower arm turn main driving gear 16.

The robot 1 includes a lifting mechanism (not shown). For example, the lifting mechanism includes a known ball screw mechanism (not shown) and an encoder-equipped servo motor (not shown) configured to drive the ball screw mechanism. The ball screw mechanism lifts and lowers in the Z direction a movable body (not shown) at which a lower arm rotating shaft 21 and the lower arm driving portion 15 are provided. With this, the lower arm 20, the upper arm 30, and the hand 2 are integrally lifted and lowered in the Z direction. Thus, the hand 2 can be lifted and lowered between a lifted position and a lowered position. A height position of the lowered position is set to be lower than a height position of the base 102 of the FOUP 101. A height position of the lifted position is set to be higher than a height position of the uppermost substrate supporting portion 101d.

The lower arm 20 is, for example, a hollow plate-shaped member and is formed in a substantially strip shape in a plan view. As shown in FIG. 3, the lower arm 20 includes the lower arm rotating shaft 21 formed so as to project downward from a bottom surface of a base end portion of the lower arm 20. The lower arm rotating shaft 21 is attached to the base 10 so as to be turnable about the rotation axis L1 extending in the Z direction. Therefore, the lower arm 20 is configured to turn on an X-Y plane. In the present embodiment, the rotation axis L1 constitutes a reference point O on the X-Y plane.

A lower arm turn driven gear 22 is fixed to a lower end portion of the lower arm rotating shaft 21. The lower arm turn driven gear 22 is provided at the same height position as the lower arm turn main driving gear 16 of the base 10 and meshes with the lower arm turn main driving gear 16. An upper arm driving portion 25 including a servo motor is provided in the lower arm 20. The upper arm driving portion 25 includes an upper arm turn main driving gear 26.

An angular position of the lower arm 20 relative to the base 10 around the rotation axis L1 is detected by an encoder of the servo motor of the lower arm driving portion 15.

The upper arm 30 is, for example, a hollow plate-shaped member and is formed in a substantially strip shape in a plan view. As shown in FIG. 3, the upper arm 30 includes an upper arm rotating shaft 31 formed so as to project downward from a bottom surface of a base end portion of the upper arm 30. The upper arm rotating shaft 31 is attached to the lower arm 20 so as to be turnable about a rotation axis L2 extending in parallel with the rotation axis L1. Therefore, the upper arm 30 is configured to turn on the X-Y plane.

An upper arm turn driven gear 32 is fixed to a lower end portion of the upper arm rotating shaft 31. The upper arm turn driven gear 32 is provided at the same height position as the upper arm turn main driving gear 26 of the lower arm 20 and meshes with the upper arm turn main driving gear 26. A hand driving portion 35 including a servo motor is provided in the upper arm 30. The hand driving portion 35 includes a hand turn main driving gear 36.

An angular position of the upper arm 30 relative to the lower arm 20 around the rotation axis L2 is detected by an encoder of the servo motor of the upper arm driving portion 25.

The hand 2 includes: the wrist 2a formed at the base end side of the hand 2; and the blade 2b formed at a tip end side of the hand 2. The wrist 2a and the blade 2b are continuously formed.

The wrist 2a includes a hand rotating shaft 41 formed so as to project downward from a bottom surface of a base end portion of the wrist 2a. The hand rotating shaft 41 is attached to the hand 2 so as to be turnable about a rotation axis L3 extending in parallel with the rotation axes L1 and L2. Therefore, the hand 2 is configured to turn on the X-Y plane.

A hand turn driven gear 42 is fixed to a lower end portion of the hand rotating shaft 41. The hand turn driven gear 42 is provided at the same height position as the hand turn main driving gear 36 and meshes with the hand turn main driving gear 36.

An angular position of the hand 2 relative to the upper arm 30 around the rotation axis L3 is detected by an encoder of the servo motor of the hand driving portion 35.

The lower arm driving portion 15 and the upper arm driving portion 25 constitute an arm driving portion. The arm driving portion drives the lower arm 20 and the upper arm 30 to move the hand 2 on the X-Y plane.

The wrist 2a includes the camera 3 attached to an upper surface of the base end portion of the wrist 2a. The camera 3 is attached in such a direction as to be able to take an image of the blade 2b at which the substrate W is placed. The blade 2b is formed in, for example, a thin plate shape. An upper surface of the blade 2b corresponds to the "substrate placing portion" of the hand 2, and the substrate W is held by the blade 2b. The camera 3 is attached on the rotation axis L3 of the blade 2b of the hand 2.

Control Device

Figure 4:
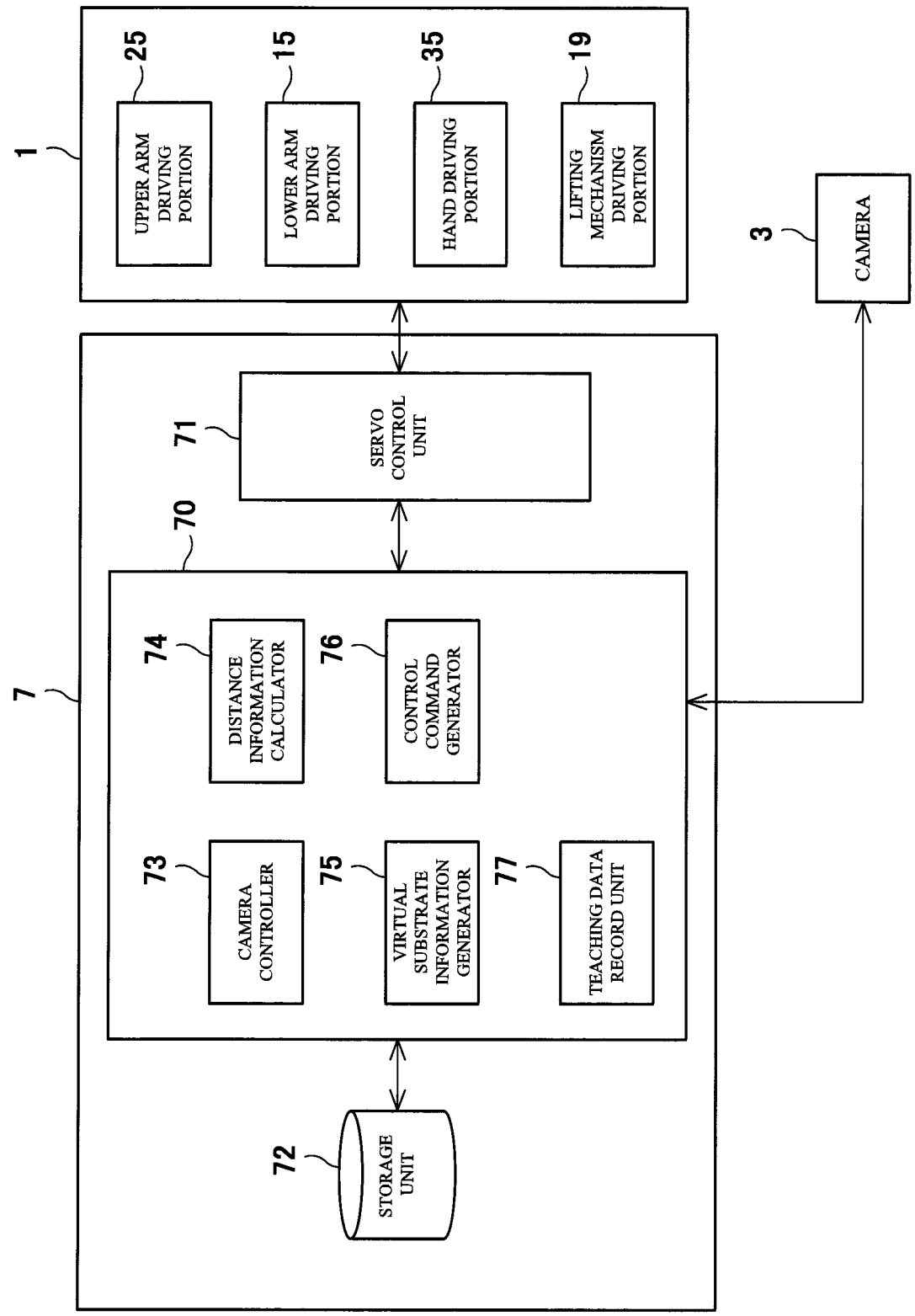
FIG. 4 is a block diagram showing the configuration of a control device of the robot.

FIG. 4 is a block diagram showing the configuration of the control device 7 of the robot 1. For example, the control device 7 includes: a control unit 70 including a calculation unit, such as a CPU; a servo control unit 71; a storage unit 72 including memories, such as a ROM and a RAM; and an interface portion (not shown). The control device 7 may be constituted by a single control device which performs centralized control or may be constituted by a plurality of control devices which cooperate to perform distributed control. The control device 7 may include a teaching control panel (not shown). Various commands may be input to the control device 7 through an input portion of the teaching control panel, and various command values, calculation results, images of the camera 3, and the like may be displayed on a display portion of the teaching control panel.

The control unit 70 includes a camera controller 73, a distance information calculator 74, a virtual substrate information generator 75, a control command generator 76, and a teaching data record unit 77. These functional portions (73 to 77) are functional blocks realized when the control unit 70 executes predetermined control programs stored in the storage unit 72.

The camera controller 73 controls the camera 3 through the interface portion (not shown). To be specific, the camera controller 73 outputs an image-taking command to the camera 3. The camera controller 73 may adjust an image-taking timing or change the position and posture of the camera 3. In the present embodiment, the position and posture of the camera 3 are set such that the camera 3 can fixedly take an image of the blade 2b of the hand 2. The camera controller 73 stores a camera image, taken by the camera 3, in the storage unit 72.

Based on the camera image taken by the camera 3, the distance information calculator 74 calculates distance information from the blade 2b (substrate placing portion) of the hand 2 to the substrate W that is the teaching target. To be specific, the distance information calculator 74 calculates the distance information based on the camera image stored in the storage unit 72.

The virtual substrate information generator 75 generates information of a virtual substrate VW virtually arranged at the blade 2b of the hand 2 in image data. Information for generating the virtual substrate VW is stored in the storage unit 72 in advance.

Based on an operation program of the robot, the control command generator 76 generates position command values of the servo motors of the driving portions 15, 25, 35, and 19. In the present embodiment, based on the distance information from the blade 2b of the hand 2 to the teaching substrate W, the control command generator 76 generates such position command values of the servo motors of the driving portions 15, 25, 35, and 19 that the virtual substrate VW coincides with the teaching substrate W. The control command generator 76 generates speed command values based on differences between the generated position command values and the detected values (actual values) of the encoders. Then, the control command generator 76 generates torque command values (current command values) based on differences between the generated speed command values and present speed values and generates control commands based on differences between the generated current command values and detected values (actual values) of current sensors. Thus, the control command generator 76 outputs the generated control commands to the servo control unit 71.

The servo control unit 71 generates currents based on the supplied control commands and supplies the generated currents to the servo motors of the driving portions 15, 25, 35, and 19 to operate the robot 1. The servo control unit 71 controls the lower arm driving portion 15 to turn the lower arm 20 on the X-Y plane and also controls the upper arm driving portion 25 to turn the upper arm 30 on the X-Y plane. Further, the servo control unit 71 controls the hand driving portion 35 to turn the hand 2 on the X-Y plane. The servo control unit 71 controls the lifting mechanism driving portion 19 to integrally lift and lower the lower arm 20, the upper arm 30, and the hand 2 in the Z direction.

The teaching data record unit 77 stores in the storage unit 72 as the teaching data the position of the hand 2 when coordinates of a surface of the teaching substrate W as the teaching target and coordinates of a surface of the virtual substrate VW have coincided with each other. In the present embodiment, the teaching data record unit 77 stores the position command values of the servo motors of the driving portions 15, 25, 35, and 19 as the teaching data in the storage unit 72.

The storage unit 72 stores predetermined operation programs, and the control unit 70 reads and executes the operation programs to control the operation of the robot 1. The predetermined operation programs denote commands which move the hand 2 of the robot 1 to a predetermined position. As described above, as the information for generating the virtual substrate VW, the storage unit 72 stores various information, such as the shape, diameter, material, and weight of the substrate W.

Operation Example

Figure 5:
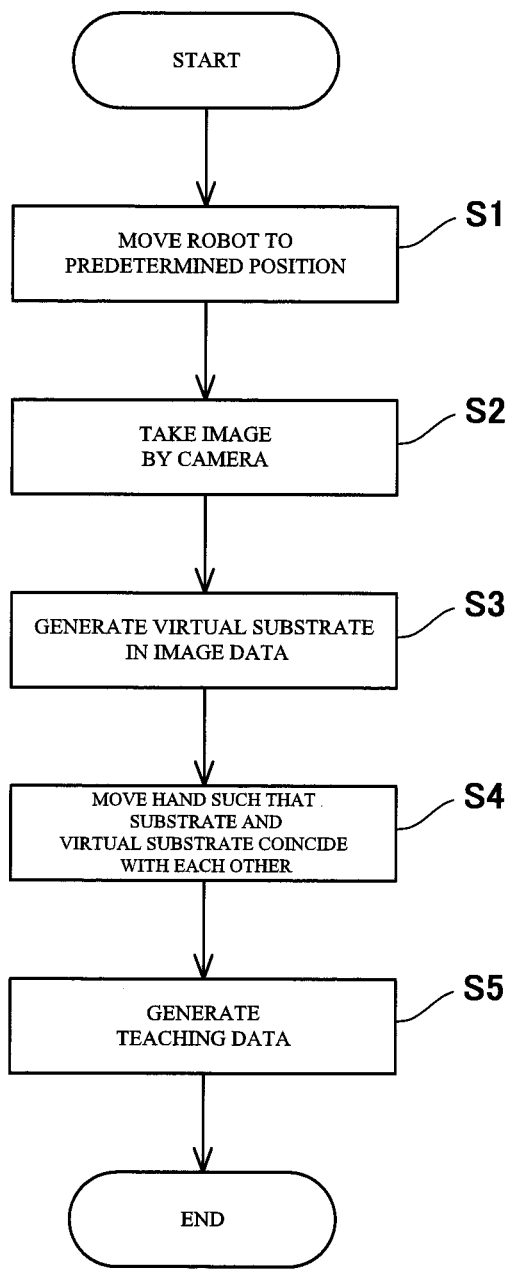
FIG. 5 is a flow chart showing one example of an operation of the robot.
Figure 6:
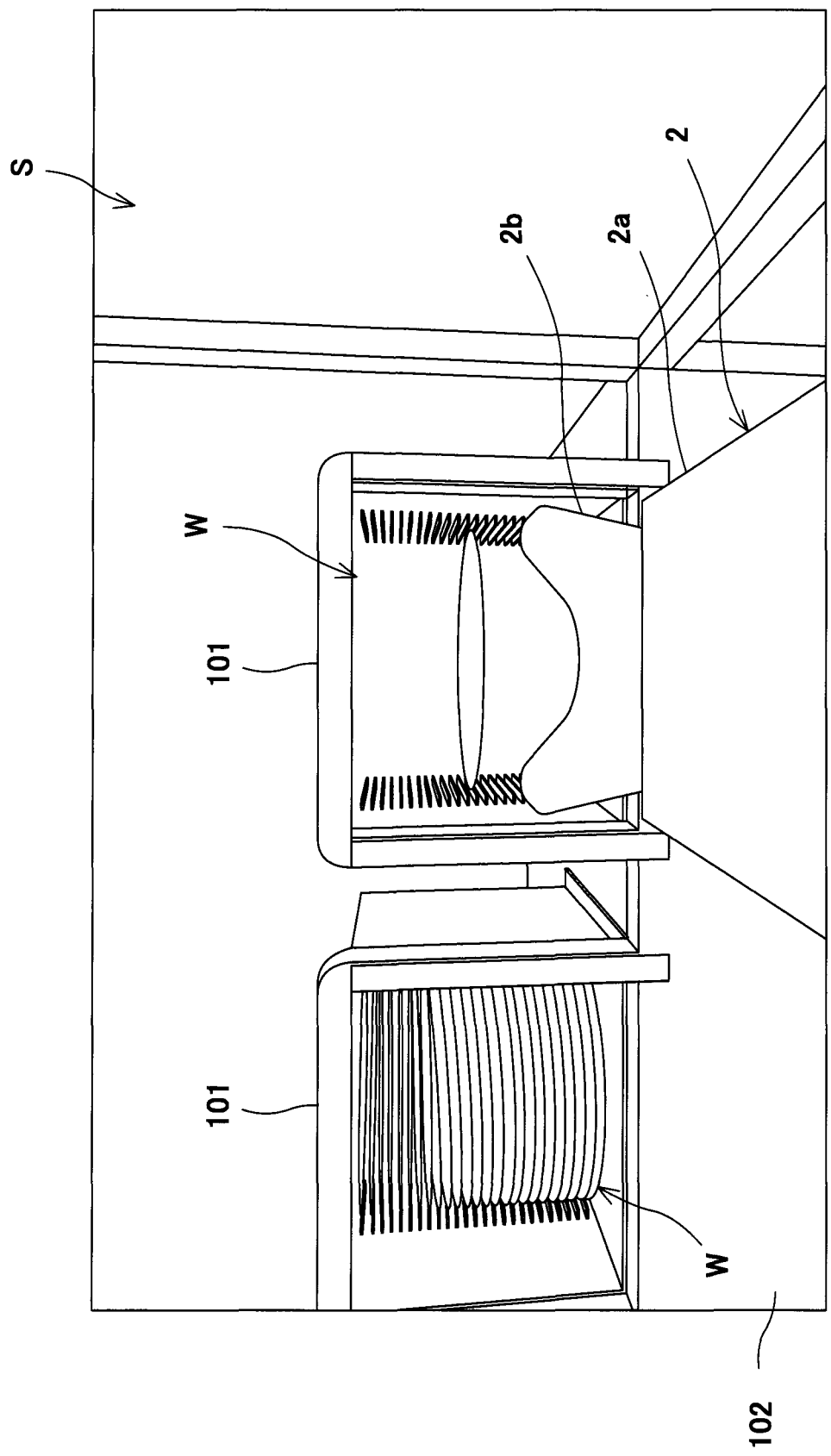
FIG. 6 is a first example of an image taken by a camera at an initial position.
Figure 7:
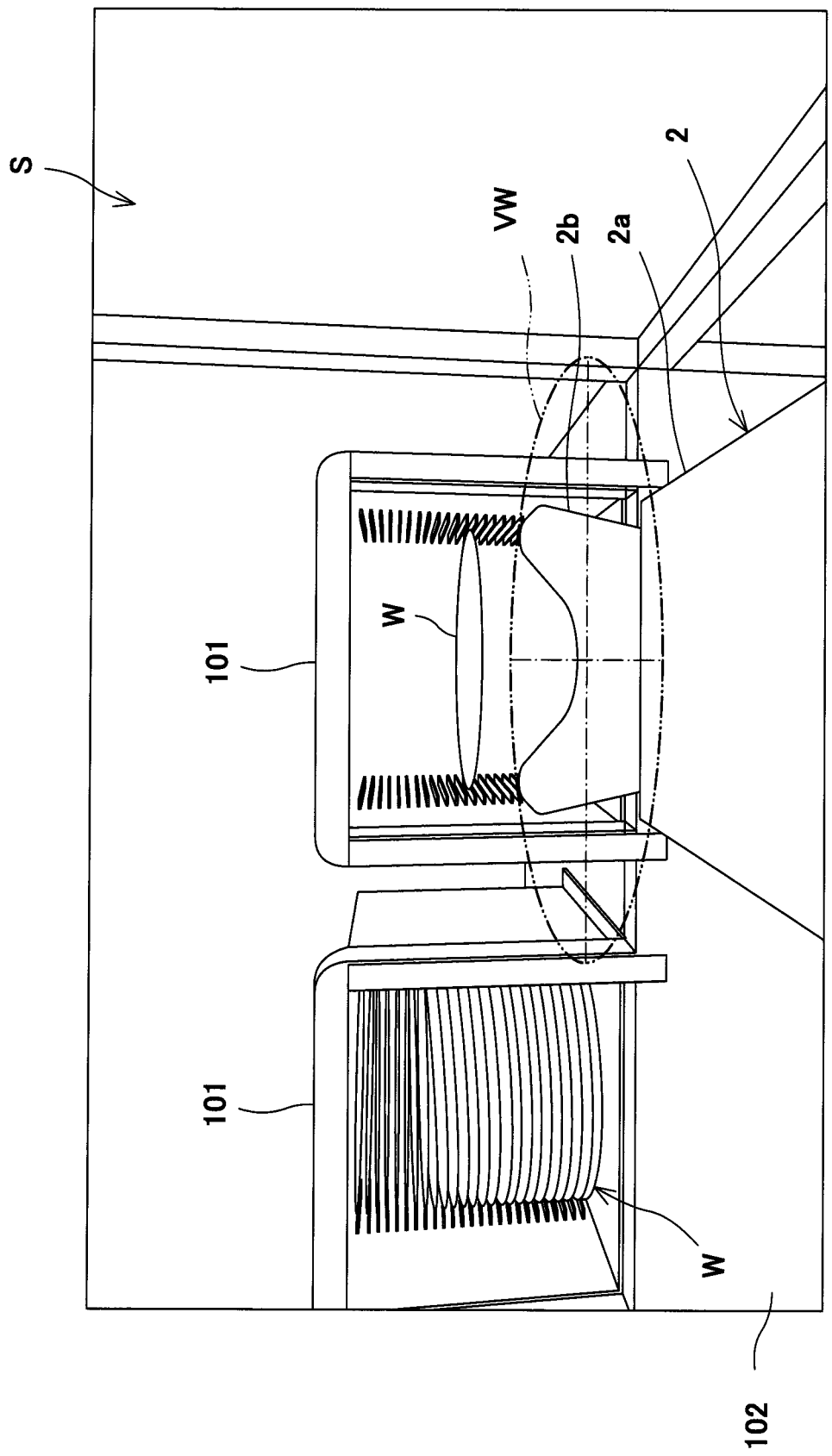
FIG. 7 is a second example of the image taken by the camera at the initial position.
Figure 8:
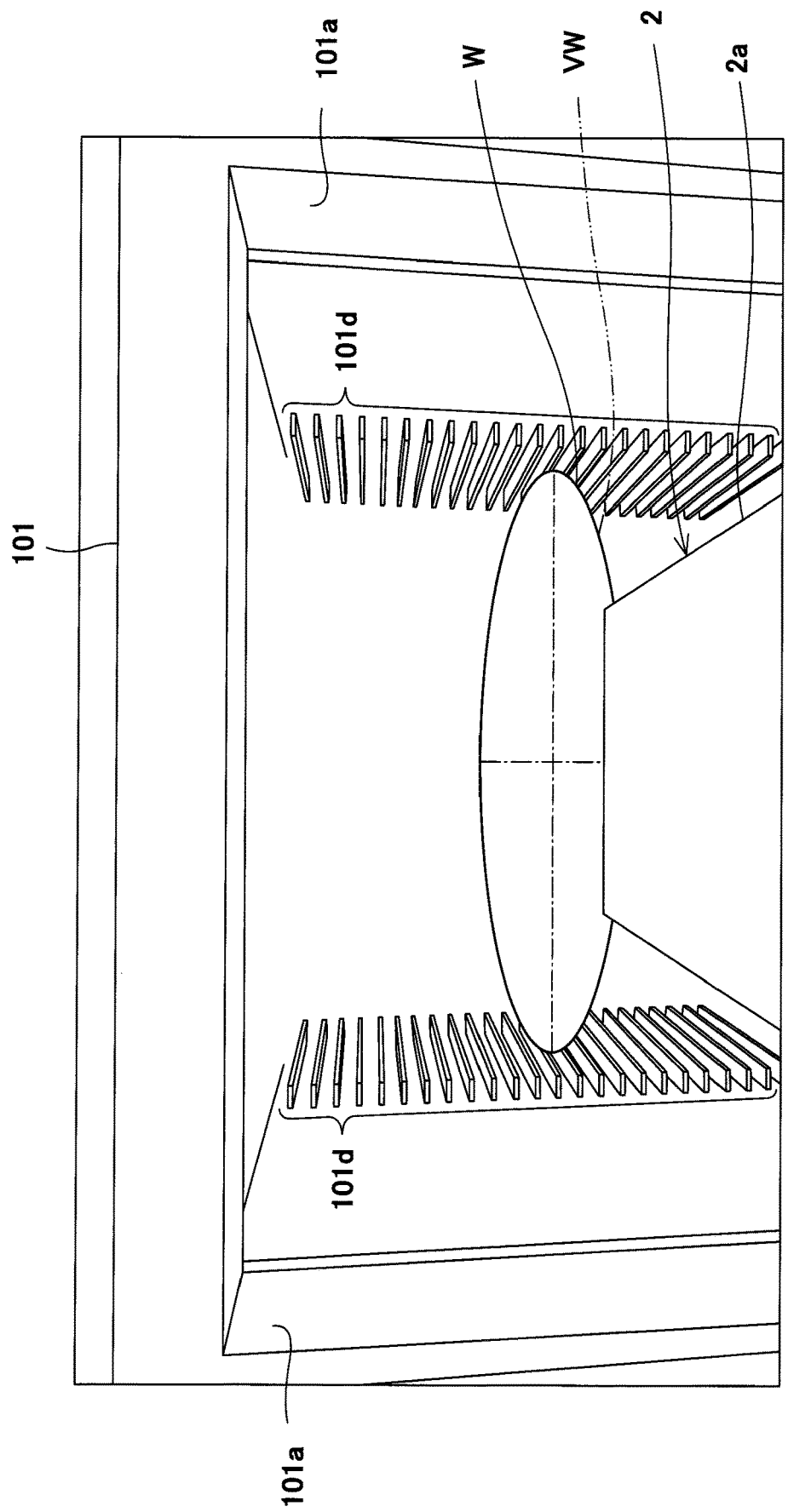
FIG. 8 is a third example of the image taken by the camera during the operation of the robot.

Next, an operation example of the robot 1 when teaching the target position T of the substrate W as the teaching target to the robot 1 will be explained. FIG. 5 is a flow chart showing one example of the operation of the robot 1. FIGS. 6 to 8 show images taken by the camera 3.

The teaching target of the present embodiment denotes the position of the hand 2 corresponding to the substrate W placed at a thirteenth shelf, from the top, of the FOUP 101 located at a right side when viewed from the robot 1. The center of this substrate W coincides with the target position T. Hereinafter, the substrate as the teaching target is referred to as the teaching substrate W.

First, the control unit 70 moves the robot 1 to an initial position (Step S1 in FIG. 5). FIG. 6 is a first example of the image taken by the camera 3 at the initial position. As shown in FIG. 6, the initial position denotes a position at which the camera 3 can take an image of a space S including the teaching substrate W and the blade 2b of the hand 2. It should be noted that a route to the initial position is stored in the storage unit 72 in advance. Specifically, the control command generator 76 generates the position command values of the servo motors of the driving portions 15, 25, 35, and 19 in accordance with the operation program of the robot and outputs the control commands. The servo control unit 71 controls the driving portions 15, 25, 35, and 19 based on the supplied control commands to move the robot 1 to the initial position.

Next, the camera 3 takes the image of the space S including the substrate W and the blade 2b of the hand 2 (Step S2 in FIG. 5). The camera controller 73 stores the camera image, taken by the camera 3, in the storage unit 72.

Next, based on the information, such as the shape of the substrate W, stored in the storage unit 72 in advance, the virtual substrate information generator 75 generates the information of the virtual substrate VW virtually arranged at the blade 2b of the hand 2 in the image data (Step S3 in FIG. 5). FIG. 7 is a second example of the image taken by the camera 3 at the initial position. As shown in FIG. 7, at the initial position, the virtual substrate VW is virtually arranged at the blade 2b. At this time, based on the camera image taken by the camera 3, the distance information calculator 74 calculates the distance information from the blade 2b (substrate placing portion) of the hand 2 to the teaching substrate W. In the present embodiment, the distance information calculator 74 calculates the distance information from the blade 2b to the teaching substrate W by pattern matching between the image of the virtual substrate VW and the image of the teaching substrate W.

Next, based on the distance information from the blade 2b to the teaching substrate W, the control unit 70 controls the operation of the robot arm 4 such that the virtual substrate VW coincides with the teaching substrate W (Step S4 in FIG. 5). It should be noted that as the operation program, the storage unit 72 stores in advance a rough route to the thirteenth shelf of the FOUP 101. The control command generator 76 generates the position command values of the servo motors of the driving portions 15, 25, 35, and 19 in accordance with the operation program. To be specific, since the control unit 70 can recognize the distance information from the blade 2b to the teaching substrate W in a robot coordinate system, the control unit 70 corrects the position command values of the servo motors of the driving portions 15, 25, 35, and 19 such that the coordinates of the surfaces of these substrates coincide with each other. FIG. 8 is a third example of the image taken by the camera 3. The servo control unit 71 controls the driving portions 15, 25, 35, and 19 based on the supplied control commands to operate the robot arm 4. With this, as shown in FIG. 8, the teaching substrate W13 and the virtual substrate VW can coincide with each other.

Finally, the teaching data record unit 77 stores in the storage unit 72 as the teaching data the position of the hand 2 when the coordinates of the surface of the teaching substrate W and the coordinates of the surface of the virtual substrate VW have coincided with each other (Step S5 in FIG. 5). Herein, storing the position of the hand 2 as the teaching data denotes that the position of the hand 2 is stored (registered) as information, such as the operation program, that is reproducible by the control device 7. In the present embodiment, the teaching data record unit 77 stores the position command values of the servo motors of the driving portions 15, 25, 35, and 19 as the teaching data in the storage unit 72.

Therefore, according to the present embodiment, only by taking the image of the space S including the teaching substrate W at the target position T and the blade 2b of the hand 2 by the camera 3, the distance information from the blade 2b to the teaching substrate W can be calculated based on the camera image, and the operation of the robot 1 can be controlled based on the distance information such that the virtual substrate VW virtually arranged at the blade 2b coincide with the teaching substrate W. By storing the position of the hand 2 at this time as the teaching data, the position of the hand 2 corresponding to the target position T of the substrate W can be taught to the robot 1. With this, the correct position can be accurately taught to the robot 1 without depending on the skill of the operator.

The distance information calculator 74 calculates the distance information from the blade 2b of the hand 2 to the teaching substrate W by the pattern matching between the image of the virtual substrate VW and the image of the teaching substrate W. However, the present embodiment is not limited to this. The distance information to a target object (teaching substrate W) may be calculated by a known method. For example, the distance information to an object may be acquired by: attaching a color filter to a lens of the camera 3; and performing image analysis of blurs and color drifts generated in a taken image in accordance with a distance to the object.

Other Embodiments

In the present embodiment, the storage unit 72 stores in advance as the operation program the rough route to the thirteenth shelf of the FOUP 101 at which a teaching substrate W13 at the target position T is placed, and the control command generator 76 corrects the position command values of the servo motors of the driving portions 15, 25, 35, and 19. However, the position command values of the servo motors of the driving portions 15, 25, 35, and 19 may be generated based on the distance information from the blade 2b of the hand 2 to the teaching substrate W such that the virtual substrate VW coincides with the teaching substrate W.

In the present embodiment, an actual semiconductor wafer is used as the teaching substrate W. However, a simulated substrate having the same shape as an actual substrate may be used.

In the present embodiment, the camera 3 is fixed and attached to the wrist 2a of the hand 2. However, the camera 3 may be detachable. In this case, the camera 3 is attached during the teaching and may be detached when the robot 1 operates in a repeat mode.

In the present embodiment, a plurality of cameras 3 may be arranged, or a three-dimensional camera may be used. The three-dimensional camera simultaneously takes images of a target object from different directions to generate parallaxes, thereby acquiring the distance information to the target object. The three-dimensional camera can generate coordinate data of a surface of the target object in a predetermined coordinate system. The three-dimensional camera is a type of stereo camera. The three-dimensional camera includes a pair of cameras arranged away from each other by a predetermined distance, and these cameras include respective image pickup elements. The three-dimensional camera may acquire not only the distance information but also color information (RGB, etc.) of the target object. Further, the three-dimensional camera may emit a laser and acquire the distance information to a reflection point from a reflection position and a reflection time.

From the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the scope of the present invention.

INDUSTRIAL APPLICABILITY

The present invention is useful when teaching the position of a hand of a robot configured to carry a substrate.

REFERENCE SIGNS LIST 1 robot
2 hand
2a wrist
2b blade (substrate placing portion)
3 camera
4 robot arm
7 control device (robot controller)
10 base
20 lower arm
30 upper arm
70 control unit
71 servo control unit
72 storage unit
73 camera controller (image data acquirer)
74 distance information calculator
75 virtual substrate information generator
76 control command generator
77 teaching data record unit
100 semiconductor processing equipment 101 FOUP
102 base (FOUP)
110 substrate processing apparatus
S image-taking space
VW virtual substrate
W substrate (teaching substrate)

The invention claimed is:

1. A method of teaching a position of a hand of a robot configured to carry a substrate to a substrate target position at which the substrate is to be placed, the method comprising:
arranging a teaching substrate as a teaching target at the substrate target position;
fixing and attaching a camera to a portion of the hand other than a substrate placing portion of the hand such that the camera takes an image of the substrate placing portion, the substrate being placed at the substrate placing portion;
moving the robot to a predetermined position at which the camera is able to take an image of a space including the teaching substrate and the substrate placing portion of the hand;
acquiring image data taken by the camera, the image data including the teaching substrate and the substrate placing portion of the hand, the teaching substrate being arranged as the teaching target at the substrate target position;
generating information of a virtual substrate virtually arranged at the substrate placing portion of the hand in the image data of the camera;
calculating distance information from the substrate placing portion to the teaching substrate based on the image data of the camera;
controlling an operation of the robot based on the distance information from the substrate placing portion to the teaching substrate such that the virtual substrate coincides with the teaching substrate; and
storing in a storage unit as teaching data, a position of the hand when the virtual substrate has coincided with the teaching substrate.

2. A control device of a robot,
the robot comprising:
a robot arm;
a hand attached to a tip end of the robot arm; and
a camera fixed and attached to a portion of the hand other than a substrate placing portion of the hand so as to take an image of the substrate placing portion, a substrate being placed at the substrate placing portion, wherein
the robot carries the substrate to a substrate target position at which the substrate is to be placed,
the control device comprising:
an image data acquirer configured to acquire image data taken by the camera, the image data including a teaching substrate and the substrate placing portion of the hand, the teaching substrate being arranged as a teaching target at the substrate target position;
a virtual substrate information generator configured to generate information of a virtual substrate virtually arranged at the substrate placing portion of the hand in the image data of the camera;
a distance information calculator configured to calculate distance information from the substrate placing portion to the teaching substrate based on the image data of the camera;
a robot operation control unit configured to control an operation of the robot arm based on the distance information from the substrate placing portion to the teaching substrate such that the virtual substrate coincides with the teaching substrate; and
a storage unit configured to store, as teaching data, a position of the hand when the virtual substrate has coincided with the teaching substrate.

3. A robot configured to carry a substrate to a substrate target position at which the substrate is to be placed,
the robot comprising:
a robot arm;
a hand attached to a tip end of the robot arm;
a camera fixed and attached to a portion of the hand other than a substrate placing portion of the hand so as to take an image of the substrate placing portion, the substrate being placed at the substrate placing portion;
an image data acquirer configured to acquire image data taken by the camera, the image data including a teaching substrate and the substrate placing portion of the hand, the teaching substrate being arranged as a teaching target at the substrate target position;
a virtual substrate information generator configured to generate information of a virtual substrate virtually arranged at the substrate placing portion of the hand in the image data of the camera;
a distance information calculator configured to calculate distance information from the substrate placing portion to the teaching substrate based on the image data of the camera;
an operation control unit configured to control an operation of the robot arm based on the distance information from the substrate placing portion to the teaching substrate such that the virtual substrate coincides with the teaching substrate; and
a storage unit configured to store, as teaching data, a position of the hand when the virtual substrate has coincided with the teaching substrate.

4. The robot according to claim 3, wherein the camera is fixed and attached to a base end portion of the hand.

5. The robot according to claim 3, wherein the distance information calculator calculates the distance information from the substrate placing portion to the teaching substrate by pattern matching between an image of the virtual substrate and an image of the teaching substrate.

6. The robot according to claim 4, wherein the distance information calculator calculates the distance information from the substrate placing portion to the teaching substrate by pattern matching between an image of the virtual substrate and an image of the teaching substrate.

* * * * *